United States Patent [19]

Fickes et al.

[11] 4,452,879
[45] Jun. 5, 1984

[54] PREPARATION OF OZONE RESISTANT PRINTING PLATES

[75] Inventors: Michael G. Fickes, Colts Neck; Peter F. Warfield, Westfield, both of N.J.

[73] Assignee: E. I. Du Pont de Nemours and Company, Wilmington, Del.

[21] Appl. No.: 531,992

[22] Filed: Sep. 13, 1983

[51] Int. Cl.$^3$ .............................................. G03C 5/00
[52] U.S. Cl. .................................. 430/306; 430/300; 430/309; 430/325; 430/331; 430/286
[58] Field of Search ............... 430/300, 306, 286, 325, 430/331, 309

[56] References Cited

U.S. PATENT DOCUMENTS 4,320,188  3/1982  Heinz et al. ........................ 430/281
4,323,637  4/1982  Chen et al. ......................... 430/271

OTHER PUBLICATIONS

Chemicals for Elastomers, NBC Protective Agent for Synthetic Elastomers, E. I. Du Pont de Nemours & Co., Inc., 10/63, pp. 1-and enclosures (4 pp.) Vanderbilt News, vol. 38, No. 1, 1982, pp. 10, 11, 34 and 35.

Primary Examiner—Jack P. Brammer

[57] ABSTRACT

Process for improving ozone resistance of photosensitive flexographic relief printing plates prepared from at least 30% by weight of a block copolymer as defined, at least 1% by weight of at least one addition polymerizable ethylenically unsaturated compound, and a polymerization initiator wherein there is applied to the dry relief surface of said plates a solvent solution containing at least 1% by weight of a nickel or zinc dialkyldithiocarbamate compound where alkyl is from 1 to 4 carbon atoms. The treated plates which possess improved ozone resistance are useful for flexographic printing.

12 Claims, No Drawings

PREPARATION OF OZONE RESISTANT PRINTING PLATES

DESCRIPTION

1. Technical Field

This invention relates to a process for improving the ozone resistance of printing plates. More particularly this invention relates to a process for treating photosensitive printing plates with a solution containing a dithiocarbamate compound.

2. Background Art

Flexographic printing plates which are useful for letterpress printing of packaging materials, e.g., cardboard, plastic film, etc., have been conventionally made of rubber. In recent years new types of flexographic printing plates which are photosensitive are gaining greater commercial acceptance. One such photosensitive printing plate is prepared from a photosensitive element described in Chen and Brennan U.S. Pat. No. 4,323,637. Such photosensitive elements comprise a layer of a solvent-soluble, thermoplastic, elastomeric block copolymer, a nongaseous ethylenically unsaturated compound, and an addition polymerization initiator activatable by actinic radiation interposed between a support and cover sheet. A flexible polymeric film, e.g., a polyamide, is generally interposed between the cover sheet and the surface of the photosensitive layer.

In using the photosensitive printing plates, printing reliefs having characters of uniform printing height are produced by exposing the photosensitive layer to actinic radiation first through the support to polymerize the plate area adjacent to the support (designated floor) and then, after removal of the cover sheet, through an image-bearing transparency (negative or positive) placed over the flexible, polymeric film and photosensitive layer. The nonexposed areas of the layer and the flexible, polymeric film are then removed by treatment with a suitable solvent in which the polymerized composition in the exposed areas is insoluble. After drying, a printing relief of the line or halftone image of the transparency is obtained. The printing plate in order to make it more suitable for lengthy printing generally undergoes several further treatments. One such treatment is a halogen treatment (finishing), e.g., chlorine, bromine, which eliminates the tackiness of the surface. After the halogen treatment, the printing plate is given an overall exposure to actinic radiation designated "postexposure" to insure that the plate is fully exposed. The printing plate is then attached to a printing cylinder and copies of the relief image are printed.

It has been found that when the printing plate is exposed to the air in a standard printing room, particularly in the warmer months of the year, the ozone present in the air causes cracking of the relief surface. Ozone cracking is manifested generally by the initial appearance of short, deep cracks perpendicular to the direction of curvature of the plate, i.e., across the cylinder. These cracks may start on the printing surface, but when cracking is severe, the cracks go over the edge of the relief surface onto the floor of the printing plate. The thicker the plate, the more readily it cracks because of the greater stress caused by wrapping the plate around the printing cylinder. Severe cracks damage the plate sufficiently to make it useless for printing.

It is therefore desirable to provide a process for the preparation of relief flexographic printing plates which are substantially more ozone resistant. Such process should be easily accomplished without affecting the known process of making photosensitive relief printing plates.

DISCLOSURE OF THE INVENTION

In accordance with this invention there is provided a process for improving the ozone resistance of the surface of relief flexographic printing plates wherein the reliefs are prepared by imagewise exposure with actinic radiation and liquid washout development of the unexposed areas of a layer of a photosensitive elastomeric composition comprising (1) at least 30% by weight of a block copolymer having (A) at least one solvent-soluble, thermoplastic nonelastomeric block having a glass transition temperature above 25° C. and a number average molecular weight of about 2,000 to 100,000; (B) an elastomeric polymeric mid-block having a glass transition temperature below 10° C. and a number average molecular weight of about 25,000 to 1,000,000; and (C) a polymer block taken from the group of nonelastomeric block (A) and a polymer block having a glass transition temperature in the range of $-30°$ C. to $+15°$ C. prepared by homopolymerization or copolymerization of aliphatic diene hydrocarbon of 4 to 5 carbon atoms or by random copolymerization of at least one aliphatic diene hydrocarbon of 4 or 5 carbon atoms with at least one styrene monomer of the formula $CH_2=CRR'$, where R is hydrogen or methyl and R' is phenyl or $C_1$ to $C_4$-alkyl-substituted phenyl;

(2) at least 1% by weight of at least one addition polymerizable ethylenically unsaturated compound containing at least one terminal ethylenic group; and (3) a polymerization-effective amount of polymerization initiator activatable by actinic radiation, wherein after drying there is applied to the dry relief surface of the printing plate a solvent solution containing at least 1% by weight of a dithiocarbamate compound taken from the group consisting of nickel dialkyldithiocarbamate and zinc dialkyldithiocarbamate wherein alkyl is from 1 to 4 carbon atoms.

The solvent-soluble photosensitive elastomeric compositions used in the process of this invention comprise (a) an elastomeric block copolymer as defined above, (b) a nongaseous, ethylenically unsaturated compound, (c) an organic, radiation-sensitive, free-radical generating photoinitiator or photoinitiator system, as well as other additives, e.g., thermal addition polymerization inhibitors, antioxidants, polymeric or nonpolymeric organic or inorganic fillers or reinforcing agents, plasticizers, etc. The compositions may be used in layer form or the layer may be adhered to flexible supports, or a temporary support may be used. Another configuration may have a cover sheet and polymeric layer on each side of the photosensitive layer. The photosensitive layers are in the thickness range of 0.005 to 0.250 inch (about 0.13 to 6.35 mm) or more.

Useful block copolymers (a) are disclosed in Heinz et al. U.S. Pat. No. 4,320,188 and Chen and Brennan U.S. Pat. No. 4,323,637. The ABC block copolymers of U.S. Pat. No. 4,320,188 have the structure in which the polymer block A, accounting for from 5 to 25% by weight, preferably from 7 to 20% by weight, of the block copolymer, is prepared from one or more styrene monomers of the formula $CH_2=CRR'$ where R is hydrogen or methyl and R' is phenyl or $C_1$ to $C_4$-alkyl-substituted phenyl, and has a second order transition point about +25° C.; the polymer block B which accounts for from 15 to 90% by weight of the block copolymer is prepared from one or more aliphatic diene hydrocarbons of 4 or 5 carbon atoms and has a second order transition point below −20° C.; and the polymer block C which accounts for from 5 to 60% by weight of the block copolymer is prepared by homopolymerization or copolymerization of one or more aliphatic diene hydrocarbons of 4 or 5 carbon atoms and has a second order transition point of from −30° C. to +15° C. and preferably from −20° C. to 10° C. These ABC block copolymers are more specifically described in U.S. Pat. No. 4,320,188, column 3, line 22 to column 4, line 7, the disclosure of which is incorporated by reference. Block copolymers ABC in which the polymer block C is incompatible with the polymer block A are useful. The block copolymers of U.S. Pat. No. 4,323,637 are more specifically described in column 4 lines 7 to 60, the disclosure of which is incorporated by reference.

The number average molecular weights for the block copolymers can be determined by membrane osmometry utilizing a gel cellophane 600 W membrane manufactured by Arro Laboratories, Inc., Joliet, IL and toluene as the solvent at 29° C. The $\overline{M}n$ for the nonelastomeric polymer blocks and elastomeric polymer blocks are preferably determined as follows:

A. The molecular weight of the first block (e.g., polystyrene) can be measured by gel permeation chromatography (GPC) of a terminated sample removed immediately after the polymerization. The chromatograph is calibrated using commercially available polystyrene molecular weight standards.

B. The $\overline{M}n$ of the second block (e.g., polyisoprene or polybutadiene) can be determined in the following manner:

(1) measuring by suitably calibrated GPC the $\overline{M}n$ of a sample of polystyrene-polyisoprene (or polybutadiene) diblock polymer terminated and removed immediately after its polymerization, and (2) subtracting from this value the $\overline{M}n$ of the first block as determined in (A) above.

C. The $\overline{M}n$ of the third block (e.g., polystyrene) can be determined in the same general manner:

(1) measuring by suitably calibrated GPC the $\overline{M}n$ of a sample of polystyrene-polyisoprene (or polybutadiene)-polystyrene triblock polymer, and (2) subtracting from this value the $\overline{M}n$ of the diblock polymer obtained in (B) above. The block copolymers of the ABA type are manufactured by Shell Chemical Company and sold under the trademark "Kraton ®".

Useful nongaseous, ethylenically unsaturated compounds (b) contain at least one terminal ethylenic group, preferably two terminal ethylenic groups, are capable of forming a high polymer by free-radical initiated chain-propagating addition polymerization and are compatible with the block copolymers set forth above. Suitable ethylenically unsaturated compounds are disclosed in U.S. Pat. No. 4,323,637, column 4, line 61 to column 5, line 18, which is incorporated by reference. Other compatible monomers may be used as are known to those skilled in the art. The most preferred ethylenically unsaturated compounds are triethylene glycol diacrylate, triethylene glycol dimethacrylate, hexamethylene glycol dimethacrylate and hexamethylene glycol diacrylate.

The ratio of the weight of block copolymer used to the weight of addition polymerizable ethylenically unsaturated compound is 99:1 to about 1:1. In order to secure a substantially transparent mixture, i.e., a non-radiation-scattering mixture, the block copolymer binder should be compatible with, and preferably soluble in, the ethylenically unsaturated compound in the proportions used.

By "compatible" is meant the ability of two or more constituents to remain dispersed in one another without causing any significant amount of scattering of actinic radiation. Compatibility is often limited by the relative proportions of the constituents, and incompatibility is evidenced by formation of haze in the photosensitive composition. Some slight haze can be tolerated from such compositions before or during exposure in the preparation of printing reliefs, but when fine detail is desired, haze should be completely avoided. The amount of ethylenically unsaturated compound, or any other constituent, used is therefore limited to those concentrations which do not produce undesired light scatter or haze.

Useful polymerization initiators activatable by actinic radiation (C) include an organic, radiation-sensitive free radical generating photoinitiator compound or photoinitiator system made up of several compounds. The initiators are useful in amounts from about 0.001 to about 10% by weight, and preferably from about 0.1 to about 5% by weight based on the total weight of solvent-free photosensitive composition. Useful initiators of addition polymerization are disclosed in U.S. Pat. No. 4,323,637, column 5, line 53 to column 6, line 23, which is incorporated by reference.

A small amount of thermal addition polymerization inhibitor is generally present in the photosensitive composition, e.g., 0.001% to 2.0%, based on the weight of the total solvent-free photosensitive composition. Useful inhibitors are disclosed in U.S. Pat. No. 4,323,637, column 6, lines 27 to 38, which is incorporated by reference.

The oxygen resistance of the printing reliefs can be improved by incorporating into the photosensitive composition a suitable amount of compatible well-known antioxidants. Useful antioxidants include: alkylated phenols, e.g., 2-6-di-tert-butyl-4-methylphenol; alkylated bis-phenols, e.g., 2,2-methylene-bis-(4-methyl-6-tert-butylphenol); 1,3,5-trimethyl-2,4,6-tris-(3,5-di-tert-butyl-4-hydroxybenzyl)benzene; 2-(4-hydroxy-3,5-di-tert-butylanilino)-4,6-bis-(n-octyl thio)-1,3,5-triazine; polymerized trimethyldihydroquinone; and dilauryl thiopropionate.

The photosensitive layer preferably contains a compatible plasticizer to lower the glass transition temperature of the binder and facilitate selective development. The plasticizer may be any of the common plasticizers compatible with the polymeric binders. Among the common plasticizers are dialkyl phthalates, alkyl phosphates, polyethylene glycol, polyethylene glycol esters, polyethylene glycol ethers, oleic acid, lauric acid, polyesters, e.g., polyethylene sebacate, etc.; and a mixture of paraffinic, naphthenic and aromatic hydrocarbons such as Shellflex ® Oil 371 manufactured by Shell Chemical Co., Houston, Texas. The plasticizer is generally present in an amount of 1 to 15% by weight based on weight of total solids of the photosensitive composition.

The photosensitive compositions of this invention can be prepared in any suitable way by mixing the ingredients, i.e., (a) the block copolymer binder, (b) the compatible ethylenically unsaturated compound, and (c) the free-radical generating initiator or initiator system. For example, flowable compositions can be made by mixing them and other desired adjuvants in any order and, if desired, with the aid of a solvent such as chlorinated hydrocarbons, e.g., methylene chloride, chloroform, methyl chloroform, chlorobenzene, trichloroethylene, tetrachloroethylene and chlorotoluene; ketones, e.g., methyl ethyl ketone, diethyl ketone and methyl isobutyl ketone; aromatic hydrocarbons, e.g., benzene, toluene and xylene; and tetrahydrofuran. The above solvents can contain as diluents acetone; lower molecular weight alcohols, e.g., methyl, ethyl and propyl alcohol; and esters, e.g., methyl, ethyl and butyl acetate. The solvent can be removed later by heating the admixture or extruded layer.

Conventional milling, mixing, and solution techniques can be used in making these compositions, the particular technique varying with the differences in properties of the respective components. The homogeneous, substantially nonradiation-scattering compositions, are formed into sheets in any desired manner. For example, solvent-casting, hot pressing, calendering, or extrusion are suitable methods for preparing layers of the desired thickness.

The photosensitive elements of this invention can be made by solvent casting or by extruding, calendering or pressing at an elevated temperature of the photosensitive composition into the form of a layer or self-supporting sheet on a suitable casting wheel, belt or platen. The layer or sheet may be laminated to the surface of the flexible supports such as are described in U.S. Pat. No. 4,323,637, column 6, line 58 to column 7, line 9 which is incorporated by reference. A preferred flexible support is flame-treated polyethylene terephthalate, 0.001 to 0.007 inch (0.025 to 0.18 mm) thick, preferably 0.005 inch (0.13 mm) in thickness. An adhesive layer can be present between the support and the photosensitive layer to provide strong adherence. Some useful adhesive compositions are disclosed in Plambeck U.S. Pat. No. 2,760,863 and Munger et al. U.S. application Ser. No. 384,558, filed June 3, 1982, which are incorporated by reference. Multicomponent adhesive compositions are preferred.

The dried adhesive coated support can be adhered immediately to the photosensitive layer or can be stored for subsequent adherence. The adhesive-coated support can be laminated to the photosensitive layer in a press, e.g., at 140° to 160° C. at a pressure of 20,000 to 30,000 psi (1406 to 2109 kg/cm$^2$) for up to about three minutes, followed by cooling in the press to less than 60° C. Preferably the photosensitive element is prepared by calendering. The photosensitive layer, which preferably is formed by extruding through a die, has present on the side remote from the side adjacent the adhesive layer a 0.005 inch (0.13 mm) thick polyethylene terephthalate film which subsequently acts as a protective cover sheet. Other films can be used such as polystyrene, polyethylene, polypropylene or other strippable material. There preferably is present between the photosensitive layer and the film cover sheet a thin hard, flexible, solvent-soluble layer, such as a flexible, polymeric film or layer, e.g., a polyamide or a copolymer of ethylene and vinyl acetate. The flexible, polymeric film remains on the photosensitive layer after removal of the film cover sheet described above. The flexible, polymeric film protects for reuse an image-bearing negative or transparency superposed thereon or improves contact or alignment with the photosensitive surface. Prior to the imagewise exposure using the sources described below, the element is exposed through the support to polymerize a predetermined thickness of the photosensitive layer adjacent the adhered support. This polymerized portion of the photosensitive layer is designated a floor. The floor thickness varies with the time of exposure, exposure source, etc. The exposure is generally for 1 to 30 minutes and can be accomplished flat or in the round.

Printing reliefs can be made in accordance with this invention by exposing to actinic radiation selected portions of a photosensitive layer of an element described above, for example, through a process transparency, i.e., an image-bearing transparency or stencil having areas substantially transparent to actinic radiation and of substantially uniform optical density and areas opaque to actinic radiation and of substantially uniform optical density until substantial addition-polymerization or photocrosslinking takes place. During the polymerization, the polymeric binder/ethylenically unsaturated compound composition is converted to the insoluble state in the radiation-exposed portions of the layer, with no significant polymerization taking place in the unexposed portions or areas of the layer. The unexposed portions of the layer are removed by means of a liquid developer for the polymeric binders. The process transparency may be constructed of any suitable material including cellulose acetate film and oriented polyester film.

Actinic radiation from any source and of any type can be used in the photopolymerization process. The radiation may emanate from point sources or be in the form of parallel rays or divergent beams. By using a broad radiation source relatively close to the image-bearing transparency, the radiation passing through the clear areas of the transparency enters as divergent beams and thus irradiates a continually diverging area in the photosensitive layer underneath the clear portions of the transparency. This results in a polymeric relief having its greatest width at the bottom of the photosensitive layer, i.e., a frustum, the top surface of the relief being the dimensions of the clear area.

Inasmuch as the free-radical generating systems activatable by actinic radiation generally exhibit their maximum sensitivity in the ultraviolet range, the radiation source should furnish an effective amount of this radiation, preferably having a wavelength range between about 2500 Å and 5000 Å. Suitable sources of such radiation, in addition to sunlight, include carbon arcs, mercury-vapor arcs, fluorescent lamps with ultraviolet radiation-emitting phosphors, argon glow lamps, electron flash units and photographic flood lamps. Electron accelerators and electron beam sources through an appropriate mask may also be used. Of these various sources, the mercury-vapor lamps, particularly the sun lamp or "black light" type, and the fluorescent sun lamps, are most suitable.

The radiation exposure time may vary from fractions of a second to minutes, depending upon the intensity and spectral energy distribution of the radiation, its distance from the composition and the nature and amount of the composition available. Customarily, a mercury vapor arc, a sunlamp or high ultraviolet output fluorescent tubes are used at a distance of about 1.5 to about 60 inches (3.8 to 152 cm) from the photosensitive composition. The exposure can be accomplished flat, e.g., in a vacuum frame, or in the round. Exposure temperatures are not particularly critical, but it is preferred to operate at about ambient temperatures or slightly higher, i.e., about 20° to about 35° C.

After exposure, the image may be developed by washing with a suitable developer. The developer liquid should have good solvent or swelling action on the polymeric binder/ethylenically unsaturated compound composition and little action on the insolubilized image or upon the support or adhesive layer in the period required to remove the nonpolymerized or noncrosslinked portions. Suitable developers include: organic solvents, e.g., 2-butanone, benzene, toluene, xylene, trichloroethane, trichloroethylene, methyl chloroform, tetrachloroethylene, and solvent mixtures, e.g., tetrachloroethylene/n-butanol, etc.

Development may be carried out at about 25° C., but best results are sometimes obtained when the solvent is warm, e.g., 30°–60° C. Development time can range from 1 to 120 minutes, preferably 1 to 25 minutes.

In the washout development step during which the relief is formed, the developer may be applied in any convenient manner, as by pouring, immersion, spraying, or roller application. Brushing aids in the removal of the unpolymerized portions of the composition.

After development the printing plate is preferably heated briefly in a forced hot air dryer or other heating means. This brief drying period evaporates some but not all of the solvent making the plate less pasty and easier to handle in subsequent steps. Generally the plate is heated at a temperature range of 30° to 60° C. for 1 to 5 minutes. The brief heating can be accomplished with the plate flat or on a cylinder.

It is often desirable after removing the plate from the heat source to wipe the plate surface with a cloth dampened with methylchloroform (in a hood). Printing plates having a block copolymer binder are susceptible to an undesirable surface defect known as "orange peel" which the wiping step eliminates.

After development, the printing plate is dried either in the flat mode or preferably while attached to a cylinder, preferably of the same dimension that will subsequently be used for printing. Useful drying cylinders include: steel, plastic, e.g., polyvinyl chloride; cardboard, etc. Suitable drying means include a dryer equipped with an infrared heat source such as a Cyrel ® Dryer (registered trademark E. I. du Pont de Nemours and Company) or a Cyrel ® 3040 Dryer wherein the printing plate is dried flat. Generally the printing plate is dried at temperatures up to 125° C., preferably for about one hour at a temperature of about 50° to 80° C.

The plate can then be contacted with an aqueous halogen finishing or detackifying treatment solution, e.g., flooded or preferably dipped in the solution, and maintained in contact for from 15 seconds to 40 minutes, more preferably from 1 to 10 minutes, at ambient temperature or a temperature up to about 35° C. Examples of treatment solutions include:

(a) aqueous hypochlorite solution, e.g., 900 parts water, 90 parts Clorox ®, 10 parts concentrated HCl;

(b) aqueous bromine solution, 0.01 to 3.5% by weight, preferably potassium bromate-potassium bromide having a solution pH of 1.2. (The bromine solution is prepared as follows:

To 1800 ml of tap water is added 20 ml of conc. hydrochloric acid with mixing. To this solution is added with mixing a mixture of 200 ml tap water, 10 g potassium bromide and 2.8 g potassium bromate (90.56% $H_2O$/8.81% HCl/0.49% KBr and 0.14% $KBrO_3$). The free bromine concentration is 0.4%.);

(c) alkali monopersulfate, e.g., potassium monopersulfate triple salt ($2KHSO_5 \cdot KHSO_4 \cdot K_2SO_4$) and a bromide salt, e.g., potassium bromide, dissolved in aqueous solution.

Since both of the components of (c) are solids and are nonreactive with one another in the absence of moisture, they can be mixed dry and stored in moisture proof containers for an extended period prior to use. The proportions of dry ingredients in the mixture is from 98 to 10 alkali monopersulfate and from 2 to 90 bromide salt. The potassium salts are particularly preferred since they are significantly less moisture sensitive. However, other alkali salts, e.g., sodium, lithium, etc., are useful if maintained separately from each other until dissolution. It is advantageous that no acid is required to be added to the treatment solution which is operable at higher pH ranges than previously known bromine or chlorine treatment solutions and includes pH values in the neutral region, and above, e.g., 7 to 8.5 or more. The overall pH range is 0.7 to 8.5 or more; or (d) aqueous solution having free bromine or free iodior more. The overall pH range is 0.7 to 8.5 or more; or (d) aqueous solution having free bromine or free iodine followed by an aqueous chlorine solution. The aqueous bromine solution can be prepared as described in (b) and (c) immediately above. The free bromine concentration is 0.01 to 3.5% by weight and the treatment time is about 15 seconds to 20 minutes. The iodine solution is preferably prepared by addition of potassium iodide, e.g., 6.4 grams, and iodine, e.g., 12.7 grams, to 200 ml water. The contact time with the printing plate is from 1.5 to 2.5 minutes. The second treatment, aqueous chlorine solution, can be prepared as described in (a) immediately above. The chlorine is equivalent to that supplied by an aqueous solution, 0.001 to 1.0 molar in NaOCl and 0.012 to 1.2 molar in HCl. Treatment time is about 15 seconds to 5 minutes.

A water rinse and brief heating to remove the moisture follow the above halogen finishing treatment. The heating period is normally of about 1 to 5 minutes, preferably 3 minutes, in a dryer equipped with infrared heater such as the dryer described above or another suitable dryer.

Either prior to or subsequent to the above-described finishing treatment the printing plate can be overall exposed (postexposed), preferably while attached to a cylinder. The postexposure is accomplished by exposing the printing plate to a source of actinic radiation for about 5 to 15 minutes, preferably about 10 minutes. The exposure source described above can be used. When present on a cylinder, the plate-cylinder can be placed on its side in a high intensity Cyrel ® 3040 Exposure Unit (registered trademark E. I. du Pont de Nemours and Company). In this mode the postexposure is accomplished on one side and then the other. The postexposure can also be accomplished by placing the mounted printing plate in a rotary exposure unit, e.g., where the lamps surround the plate.

Ozone is known to attack double bonds present in the printing plates. Postexposure of a printing plate causes many of the remaining double bonds in the imagewise exposed and developed printing plate to react. The diminution of the number of double bonds therefore limits the effect of ozone on the printing plate. A postexposed printing plate (without halogen treatment) also has a flexible surface that is believed to aid in resistance against ozone in the air. When the printing plate is treated with halogen before or after postexposure, however, the susceptibility of the plates to ozone attack is increased. The choice of halogen and the length of halogen treatment appear to alter the effects of ozone. For example, for any given time period it has been found that bromine-treated plates crack more readily than chlorine-treated plates. The longer the treatment the sooner the plate cracks and the greater the damage to the plate. While not wishing to be limited to the following theory, we believe that the halogen treatment produces a plate surface harder and less flexible than that possessed by an untreated plate. Upon flexing, e.g., when the halogen-treated plate is wrapped around a printing cylinder, the hardened surface produces greater unrelieved stresses in the plate than are found in similar but non-halogen-treated plates. Interaction of the unrelieved stresses with microscopic physical defects in the halogen-treated plate structure produces stress concentration points which serve also as initiating points for reaction with ozone in the air, and thus produce additional stresses leading to cracking. Conversely, a postexposed printing plate without halogen treatment which has a flexible, softer relief surface less susceptible to damage is less vulnerable to attack by ozone.

The detackified, postexposed printing plate is dried, if necessary, and there is applied to the dry relief surface of the printing plate a solvent solution containing 1 to 8% by weight, preferably 4 to 8% by weight, of a dithiocarbamate compound taken from the group consisting of nickel dialkyldithiocarbamate and zinc dialkyldithiocarbamate wherein alkyl is from 1 to 4 carbon atoms. Useful dithiocarbamate compounds therefore include those with methyl, ethyl propyl, butyl, isobutyl substituents. A preferred compound is nickel di-n-butyldithiocarbamate. Other useful compounds include: nickel di-isobutyldithiocarbamate and zinc dimethyldithiocarbamate, etc. Suitable solvents include: methyl chloroform which is preferred, methylene chloride, trichloroethylene, perchloroethylene, and mixtures of these with alcohols such as n-butanol, n-propanol, ethanol, etc.

Dithiocarbamate compounds are only useful when applied via solvent to the relief surface of the imaged and postexposed printing plate. When such compounds have been mixed with other ingredients in preparing the photosensitive compositions (see Control Example 1 below), the printing plates prepared with this composition become desensitized to actinic radiation. The dithiocarbamate compound can be applied to the printing relief surface normally at ambient temperature. Application means include soaking the printing plate in the dithiocarbamate solution, e.g., for 15 seconds to 10 minutes, or by wiping the relief surface while flat or attached to a cylinder with an applicator, e.g., roller, cloth or other soft applicator, wet with the solution. The application time is not critical provided that the entire surface is uniformly covered with sufficient treatment solution. The amount of dithiocarbamate solution transferred to the printing plate is dependent on the number of times the roller or cloth passes over the relief surface, the speed with which the solution is applied, the concentration of the solution, and the amount of solution present on the applicator. Generally several passes of the solution-bearing applicator in each of the printing plate directions is required. The use of the roller applicator is preferred because of its ease of operation. The relief images will swell when the dithiocarbamate solution is applied. Some swelling can be tolerated. Depending on the thickness of the relief and the concentration of the solution, the swelling may range up to 0.002 inch (0.05 mm) when an 8% by weight solution is used. A normal swelling range is about 0.0001 to 0.0008 inch (0.0025 to 0.020 mm). The dithiocarbamate treatment may result in a rough surface as the solution dries or is optionally dried, e.g., in a suitable hot air drier for 0.25 to 3.0 hours at 60° C., preferably 1 hour at 60° C. The rough surface is believed to be the result of the crusting of the dithiocarbamate compound. The roughness is a surface phenomenon that can be alleviated by wiping the relief surface with alcohol or soap and water prior to printing. The treated printing plates exhibit excellent protection against the ozone present in the air or that may be generated in printing areas by certain equipment used by printers.

A preferred mode is illustrated in Example 3 below.

INDUSTRIAL APPLICABILITY

The process of the invention results in photosensitive flexographic printing plates, particularly those prepared from elastomeric block copolymers, having improved ozone resistance. The ozone resistance of the printing plates is particularly important in the warmer months of the year when the ozone build-up in the air causes the surface of an untreated printing plate to crack.

The ozone-resistant printing reliefs can be used in many classes of printing but are most applicable to those classes of printing wherein a distinct difference of height between printing and nonprinting areas is required and particularly to the flexographic printing class wherein a resilient printing area is required, e.g., for printing on deformable printing surfaces. These classes include those wherein the ink is carried by the raised portion of the relief such as in dry-offset printing or ordinary letterpress printing, the latter requiring greater height differences between printing and nonprinting areas, and those wherein the ink is carried by the recessed portions of the relief such as in intaglio printing, e.g., line and inverted halftone. The plates are also useful for color printing.

EXAMPLES

The following examples illustrate the invention wherein the parts and percentages are by weight.

EXAMPLE 1

A photosensitive, thermoplastic composition is prepared as follows:

1.40 parts 2,2-dimethoxy-2-phenylacetophenone is dissolved in a mixture of 5.30 parts hexamethylene glycol diacrylate, 3.70 parts hexamethylene glycol dimethacrylate, 0.166 part 2,6-di-tertiary-butyl-para-cresol and 0.001 part hydroquinone. A solution of C.I. 109 Red Dye (0.003 part) in hydroxyethyl methacrylate (0.13 part) is added to the mixture. This solution is added to 82.30 parts polystyrene-polyisoprene-polystyrene block copolymer (Kraton ® 1107 manufactured by Shell Chemical Co., Polymers Division, Houston, Tex.) in a twin screw extruder. A mixture of 6.0 parts α-methyl styrene/vinyl toluene resin manufactured by Hercules, Inc., Wilmington, DE, (softening point 100° C., refractive index 1.583, viscosity at 25° C. for a 65% solution in toluene is 1.6–1.9 poises) and 1.0 part grated microcrystalline hydrocarbon wax manufactured by International Wax Refining Co., Valley Stream, NY, (melting point 73°–76° C., flash point 113° C.) is melted at about 100°

C. and is metered into the photosensitive mixture in the extruder. The twin screw extruder performs the function of melting, mixing, deaerating, and filtering the photosensitive composition.

The following coating solution is prepared:

| Ingredient | Amount (%) |
| --- | --- |
| Methylene chloride | 81.0 |
| Methanol | 2.0 |
| N—methyl pyrolidone | 10.0 |
| Polyamide resin[1] | 7.0 |

[1]The polyamide resin, Macromelt ® 6900, a product of Henkel Adhesives Company, a division of Henkel Corporation, 4620 West 77th Street, Minneapolis, MN is essentially colorless, has a Ball and Ring Softening Point, of 266-302° F.; melt index at 175° C. is 10 to 20 g/10 minutes; percent water absorption, 1 day is 0.2, 7 days is 0.5; tensile yield of 1,200 psi; tensile break of 3,500 psi; and elongation of 540%. The tensile yield, tensile break and elongation are determined at 24° C. according to ASTM Procedure D-1708).

The above polyamide resin coating solution is coated on 0.005 inch (0.127 mm) thick polyethylene terephthalate film using an extrusion die coater to provide a dry film thickness of 0.00017 inch (0.004 mm) on the film, and the dry coated film is wound on wide stock cores.

The photosensitive composition described above is extruded at 160° C. through a die. The extruded composition enters the rotating bank in a two-roll calender and is calendered between two films, one being a 0.005 inch (0.127 mm) flame-treated polyethylene terephthalate support film, and the second being the polyamide-coated polyethylene terephthalate film described above (flame-treated and polyamide sides adjacent to the extruded photosensitive layer). The calender nip can be adjusted to produce photosensitive layers over a wide range of thicknesses, e.g., 0.112 inch (~2.85 mm) thick.

The photosensitive element having a photosensitive layer thickness of 0.112 inch (~2.85 mm) is cooled with blown air and is passed under a bank of blank light fluorescent tubes, such as Sylvania's BL lamps, placed transverse to the path of movement, continually exposing the element through its support to polymerize a predetermined thickness of the photosensitive layer adjacent the support. The element is cut into 3 inch by 6 inch (7.62 by 15.24 cm) pieces.

Several pieces of cut photosensitive element are placed in an exposure unit, as described below, and are given an overall exposure in air through the support for a predetermined length of time (for example, a 0.112-inch (~2.85 mm) thick photosensitive layer requiring the polymerization of an 0.080 inch (2.03 mm) portion of the layer is exposed for about 3 minutes depending on lamp intensity).

The polyethylene terephthalate film on the surface of the polyamide layer is stripped therefrom. The polyamide layer remains adhered to the photosensitive layer. The hard, flexible smooth polyamide surface is covered with an image-bearing transparency, and the photosensitive layer is imagewise exposed for 5 minutes under vacuum in a Cyrel ® 3040 Exposure Unit (registered trademark of E. I. du Pont de Nemours and Company) fitted with Sylvania BL-VHO fluorescent lamps.

After exposure the transparency is removed, and the exposed element pieces are placed in a rotary drum-brush type Cyrel ® 3040 Processor. The unpolymerized areas of the element pieces are removed in the processor by washing with a mixture of 75 volume percent tetrachloroethylene/25 volume percent n-butanol. The developed element pieces are then placed in a forced hot air drier or other suitable drier and are dried at 60° C. until the pieces attain their original thickness. The dry plate pieces are then detackified for 2 minutes in a solution of aqueous acidic hypochlorite (900 parts water, 90 parts Clorox ®, 10 parts conc. HCl). The wet pieces are post-exposed in air for 10 minutes using the same exposure source used for the imagewise exposure described above.

The postexposed pieces are soaked for 2 minutes in a solution prepared from 2.5 g nickel di-n-butyldithiocarbamate and 50 ml methyl chloroform. Following air drying for 15 minutes the pieces are placed on cylindrical cores and are passed through an air lock into a chamber of the "glove-box" type wherein the ozone level is maintained at 0.03 to 0.3 ppm of ozone as determined by a Dräger Multi-Gas Detector, Model 21/31 manufactured by Drägerwerk AG, Lubeck, Federal Republic of Germany. The ozone is generated by passing oxygen through a 1-liter round bottom flask fitted with an ultraviolet radiation source modified from a commercial source sold by UVP, Inc., San Gabriel, Calif. An unsoaked control piece ozone-cracked after 90 hours, while a piece treated according to the process of the invention displayed ozone-cracking after 672 hours.

CONTROL EXAMPLE 1

The following photosensitive compositions were prepared by milling the ingredients at 127° C. roll temperature for 10 to 15 minutes using a Thropp, 3 inch by 8 inch (7.62 cm by 20.32 cm) two-roll rubber mill designated #12/413.

| Ingredient | Plate A (g) | Plate B (g) |
| --- | --- | --- |
| A Styrene-isoprene-styrene block copolymer[1] | 78.8 | 76.8 |
| B Petroleum hydrocarbon oil mixture[2] | 12.0 | 12.0 |
| C Monomer Mixture<br>1. hexamethylene diacrylate 4.69 g<br>2. hexamethylene dimethacrylate 3.29 g<br>3. 2,2-dimethoxy-2-phenylacetophenone 1.25 g | 9.23 | 9.23 |
| D. Nickel di-n-butyldithio-carbamate | 0.0 | 2.0 |
| E. C.I. 109 Red Dye, 2.5% in hydroxyethyl methacrylate | 5.0 drops | 5.0 drops |
| Methylene chloride | 50.0 ml | 50.0 ml |

[1]Styrene rubber ratio 14/86; Brookfield viscosity of 25 weight percent solution in toluene at 77° C., 1600 cps; melt viscosity; melt index condition G: 9 g/10 minutes, Kraton ® 1107 manufactured by Shell Chemical Co., Houston, Texas
[2]Mixture of paraffinic, naphthenic and aromatic hydrocarbons, Shellflex ® Oil 371 manufactured by Shell Chemical Co., Houston, Texas The milled compositions were cooled and pressed onto 150 by 150 mm polyethylene terephthalate film supports on a KM steam-heated platen press, Model 2209 dammed to 0.250 inch (6.35 mm) using the following pressure-time-temperature profile: contact 2 minutes at 150° C. and minimum pressure to register on gauge, raise pressure to 5000 psi (about 350 kg/cm²), maintain for 1 minute, increase pressure to 35,000 psi (about 2460 kg/cm²), maintain for 2 minutes, release pressure, and cool platens. The resulting elements were given a uniform exposure for 30 seconds through the support in a Cyrel ® 1830 Exposure Unit (trademark E. I. du Pont de Nemours and Company) fitted with fluorescent tubes and analogous to Sylvania FR48T-12B2/VHO/180 but containing phosphor coded 2051 rather than standard 2011 phosphor (spectral output peaks at about 368 nm) and then were imaged through a photographic negative using the exposure source for 5.6 and 11 minutes (two different areas). After washing out the unexposed image areas for 20 minutes in a Cyrel ® 3040 Processor (trademark E. I. du Pont de Nemours and Company), the printing plate was dried for 60 minutes, cooled, chlorine finished for 2 minutes as described in Example I and postexposed for 10 minutes using the above-described exposure source. Control Plate A gave a normal relief image, whereas Plate B gave no relief image because of densensitization by the addition of the nickel di-n-butyldithiocarbamate.

EXAMPLE 2

A 0.250 inch (6.35 mm) thick printing plate prepared as described in Example 1 was cut into 6 inches by 6 inches (15.24 cm by 15.24 cm) pieces. The printing plate pieces were overall exposed through the support for 50 minutes and then imagewise exposed as described in Control Example 1 with no vacuum or cover sheet present, leaving 1.5 inches (3.8 cm) along two parallel sides covered with an opaque mask. The pieces were washed out for 20 minutes in a Cyrel ® 3040 Processor at the setting for the 0.250 inch (6.35 mm) thick plate, given a methyl chloroform rinse, dried for 60 minutes, allowed to cool, chlorine finished for 2 minutes as described in Example 1, and postexposed for 10 minutes using the imagewise exposure source. After the postexposed pieces were cut in half, the pieces were soaked for 4 minutes in one of the solutions containing nickel di-n-butyldithiocarbamate (NBC) shown below, dried for 5 minutes in air at ambient temperature and 30 minutes in an oven wrapped onto cylindrical cores and stored in ozone of the concentration as described in Example 1. The results were as follows:

| Solution | Plate Performance |
| --- | --- |
| NBC(1 g)/CH$_3$CCl$_3$(100 ml) | slight cracks 96 hours; cracked 336 hours |
| NBC(2 g)/CH$_3$CCl$_3$(100 ml) | few cracks 336 hours; cracked 648 hours |
| NBC(4 g)/CH$_3$CCl$_3$(100 ml) | some cracks appeared 648 hours and above |
| NBC(8 g)/CH$_3$CCl$_3$(100 ml)* | substantially no cracks at greater than 648 hours |
| NBC(4 g)/CH$_2$Cl$_2$(100 ml)* | substantially no cracks at greater than 648 hours |

*plate appearance dark when checked at 336 hours

EXAMPLE 3

Three printing plates 15 inches by 18 inches (38.1 cm by 45.7 cm), 0.112 inch (about 2.85 mm) thick were prepared through postexposure as described in Example 1, except that, in place of the chlorine treatment, the printing plate was treated for 3 minutes in a bromine solution prepared from 5 g potassium bromide, 1.4 g potassium bromate, 10 ml conc. HCl, and 1000 ml water. The printing plates were laid flat on a well ventilated surface. A 9-inch (22.86 cm) roller fitted with a nap cover about 3/16 inch (4.78 mm) thick, recommended for applying paint to smooth metal surfaces, was soaked in a 4% nickel di-n-butyldithiocarbamate/methylchloroform solution and then rolled over the image relief of one printing plate so that each relief received 3 roller passes. Similarly the other two printing plates were treated with 6% and 8% nickel di-n-butyldithiocarbamate/methylchloroform solutions, respectively. The three plates were placed in a drawer of a forced hot air drier, Cyrel ® 3040 Drier, (trademark of E. I. du Pont de Nemours and Company) at 60° C. for 1 hour. The printing plates treated with the 4% and 6% solutions increased in thickness up to about 0.0002 inch (0.005 mm), and the printing plate treated with the 8% solution increased in thickness in the range of 0.0003 to 0.0007 inch (0.0076 to 0.018 mm). Two 2 inches by 5.5 inches (0.051 cm by about 14 cm) samples were cut from each of the treated printing plates and from a control printing plate which was untreated after postexposure and one sample of each treated printing plate and a control printing plate was attached by means of adhesive tape YB 412NTA3105512H, manufactured by 3M Co., Minneapolis, Minn., to each of two 1.88 inches (4.77 cm) outer diameter cylinders. The printing plate samples on one of the cylinders were wiped with n-propanol dampened cotton pads (A. B. Dick Company) and then both cylinders were passed through an air lock into a chamber of the "glove-box" type, wherein the ozone level was maintained at 0.13 to 0.20 ppm as determined by a Drägerwerk Multi-Gas Detector, Model 21/31 manufactured by Drägerwerk AG, Lübeck, Federal Republic of Germany. The ozone was generated by passing oxygen through a 1-liter round bottom flask fitted with an ultraviolet radiation source modified from a commercial source sold by UVP, Inc., San Gabriel, Calif. The two control printing plate samples had fine cracks after 24 hours of ozone exposure, whereas the printing plate samples treated according to the invention remained crack free for more than 183 hours. The treated printing plate was useful for printing after this lengthy time.

EXAMPLE 4

The procedure of Example 1 was repeated for making 0.112 inch (about 2.85 mm) printing plates except that the printing plates were not treated with the chlorine solution or postexposed. The sample size was 7.5 inches by 18 inches (19.05 cm by 45.7 cm). The dry printing plate was surface treated as described in Example 3 using a 4% solution of nickel di-n-butyldithiocarbamate/methylchloroform, and the printing plate was dried also as described in Example 3. One 2 inches by 5.5 inches (5.08 cm by about 14 cm) sample was cut from the treated printing plate and together with a sample cut from a similar but untreated printing plate were each taped to a 1.88 inch (4.77 cm) outer diameter cylinder as described in Example 3. The samples on the cylinders were placed in the ozone chamber as described in Example 3 wherein the ozone level was 0.1 to 0.15 ppm during the testing period. The control printing plate sample developed cracks after 24 hours in the ozone chamber whereas the printing plate sample treated according to the invention developed its first ozone crack after 141 hours in the ozone chamber.

EXAMPLE 5

The procedure of Example 1 was repeated for making 0.112 inch (about 2.85 mm) printing plates except that the dry, developed printing plate was treated for 1.5 minutes in the chlorine solution prior to postexposure. Two 2 inches by 6 inches (5.08 cm by 15.24 cm) samples were cut from the 15 inches by 18 inches (38.1 cm by 45.7 cm) printing plate. One sample was placed on a flat surface and its relief image surface was wiped with a cotton pad (A. B. Dick) soaked with a 4% solution of nickel di-n-butyldithiocarbamate/methylchloroform. The treated sample was placed in a drawer of a forced hot air Cyrel ® 3040 Drier at 60° C. for 1.5 hours. The image thickness gain was 0.0004 to 0.0008 inch (0.01 to 0.02 mm). The treated sample and the untreated control sample were attached to a 1.88 (4.77 cm) outer diameter cylinder and placed in the ozone chamber described in Example 3 wherein the ozone level was about 0.15 ppm during the testing period. The control printing plate sample developed cracks after 24 hours in the ozone chamber whereas the printing plate sample treated according to the invention was crack-free after 120 hours in the ozone chamber.

EXAMPLE 6

Two printing plates, 0.112 inch (about 2.85 mm) thick, were prepared through postexposure as described in Example 3 except that the printing plates were detackified for 5 minutes in the bromine solution. Five 2 inches by 5.5 inches (5.08 cm by about 14 cm) samples were cut from each of the printing plates and a sample of each plate was placed in solutions containing 1, 2, 4, 6 and 8% nickel di-n-butyldithiocarbamate/methylchloroform for 2 minutes. The samples were removed from the treatment solutions and placed in a drawer of a forced hot air drier as described in Example 3 at 60° C. for 10.5 hours. The difference in thickness of the relief (3 samples of each treatment strength) before treatment and drying and after treatment and drying is shown in Table 1:

TABLE 1

| Treatment Solution (%) | Thickness Difference |
|---|---|
| 1 | −0.0004 to 0.0004 inch (−0.01 to 0.01 mm) |
| 2 | 0 to 0.0001 inch (0 to 0.0025 mm) |
| 4 | 0.0006 to 0.0007 inch (0.015 to 0.018 mm) |
| 6 | 0.0011 to 0.0019 inch (0.028 to 0.048 mm) |
| 8 | 0.0016 to 0.0020 inch (0.041 to 0.051 mm) |

The plate performance is shown in Table 2.

TABLE 2

| Sample | Treatment Solution (%) | Plate Performance in Ozone |
|---|---|---|
| A | Controls | Cracks appeared after 24 hours |
| A | 1 | Initial cracks by 288 hours |
| A | 2 | Initial cracks by 161 hours |
| A | 4 | Remained crackfree for 600 hours |
| A | 6 | Remained crackfree for 600 hours |
| A | 8 | Remained crackfree for 600 hours |
| B* | Controls | Cracks appeared after 4 hours |
| B | 1 | Cracks appeared after 4 hours |
| B | 2 | Cracks appeared by 96 hours |
| B | 4 | Cracks appeared by 96 hours |
| B | 6 | Remained crackfree after 168 hours |
| B | 8 | Cracks appeared by 96 hours. |

*Samples B are under greater stress since the cylinder diameter is smaller than the cylinder to which Samples A are attached.

We claim:

1. A process for improving the ozone resistance of the surface of relief flexographic printing plates wherein the reliefs are prepared by imagewise exposure with actinic radiation and liquid washout development of the unexposed areas of a layer of a photosensitive elastomeric composition comprising
   (1) at least 30% by weight of a block copolymer having (A) at least one solvent-soluble, thermoplastic nonelastomeric block having a glass transition temperature above 25° C. and a number average molecular weight of about 2,000 to 100,000; (B) an elastomeric polymeric mid-block having a glass transition temperature below 10° C. and a number average molecular weight of about 25,000 to 1,000,000; and (C) a polymer block taken from the group of nonelastomeric block (A) and a polymer block having a glass transition temperature in the range of −30° C. to +15° C. prepared by homopolymerization or copolymerization of aliphatic diene hydrocarbon of 4 to 5 carbon atoms or by random copolymerization of at least one aliphatic diene hydrocarbon of 4 or 5 carbon atoms with at least one styrene monomer of the formula $CH_2=CRR'$, where R is hydrogen or methyl and R' is phenyl or $C_1$ to $C_4$-alkyl-substituted phenyl;
   (2) at least 1% by weight of at least one addition polymerizable ethylenically unsaturated compound containing at least one terminal ethylenic group; and
   (3) a polymerization-effective amount of polymerization initiator activatable by actinic radiation,
   wherein after drying there is applied to the dry relief surface of the printing plate a solvent solution containing at least 1% by weight of a dithiocarbamate compound taken from the group consisting of nickel dialkyldithiocarbamate and zinc dialkyldithiocarbamate wherein alkyl is from 1 to 4 carbon atoms.

2. A process according to claim 1 wherein the dithiocarbamate compound is applied to the relief surface by means of a roller.

3. A process according to claim 1 wherein the dithiocarbamate compound is applied to the relief surface by soaking in said solution for 15 seconds to 10 minutes.

4. A process according to claim 1 wherein the solvent solution contains 1 to 8% by weight of said dithiocarbamate compound.

5. A process according to claim 1 wherein after the dithiocarbamate solution is applied the relief surface is dried.

6. A process according to claim 1 wherein prior to application of the dithiocarbamate solution to the relief surface the dry relief is treated with at least one halogen solution and is overall exposed to actinic radiation prior to drying.

7. A process according to claim 1 wherein the block copolymer contains at least two thermoplastic, nonelastomeric polymer blocks having a glass transition temperature above 25° C. and an average molecular weight of 2,000–100,000, and between said thermoplastic, nonelastomeric polymer blocks an elastomeric polymer block having a glass transition temperature below 10° C. and an average molecular weight of about 25,000 to 1,000,000.

8. A process according to claim 7 wherein said thermoplastic, nonelastomeric polymer blocks are the terminal polymer blocks of said copolymer and are connected by said elastomeric polymer block.

9. A process according to claim 8 wherein said copolymer is polystyrene-polyisoprene-polystyrene.

10. A process according to claim 1 wherein the dithiocarbamate compound is nickel di-n-butyldithiocarbamate.

11. A process according to claim 1 wherein the dithiocarbamate compound is nickel di-isobutyldithiocarbamate.

12. A process according to claim 1 wherein the dithiocarbamate compound is zinc dimethyldithiocarbamate.

* * * * *